United States Patent [19]

Hardin

[11] 4,105,949
[45] Aug. 8, 1978

[54] FREQUENCY SYNTHESIZER APPARATUS
[75] Inventor: Robert H. Hardin, Kent, Wash.
[73] Assignee: The Boeing Company, Seattle, Wash.
[21] Appl. No.: 787,869
[22] Filed: Apr. 15, 1977
[51] Int. Cl.² .................. H03B 21/00; H03B 21/02
[52] U.S. Cl. ................................. 331/37; 328/14; 331/38; 331/40
[58] Field of Search ............................. 331/37–43; 328/14

[56] References Cited
U.S. PATENT DOCUMENTS

| 2,617,039 | 11/1952 | Young | 331/42 X |
| 3,891,929 | 6/1975 | Carr et al. | 328/14 |

OTHER PUBLICATIONS

Finden, "The Problem of Frequency Synthesis", Journal Brit. I.R.E., Jan., 1961, pp. 95–103.

Primary Examiner—Siegfried H. Grimm
Attorney, Agent, or Firm—Christensen, O'Connor, Johnson & Kindness

[57] ABSTRACT

A frequency synthesizer, responsive to a reference signal having a frequency $f_r$, for supplying an output signal at a frequency selectable from M times N signal frequencies (where M and N are preselected integers) is disclosed. In each disclosed arrangement, a set of M signals that are each harmonically related to $f_r$ is derived by a cascade connected harmonic generator and comb filter, and a set of M signals that are each harmonically related to $f_r/M$ is derived from the reference signal by a cascaded frequency divider, harmonic generator and comb filter. Each of these signal frequencies within the two sets of signals can be selectively coupled to the input ports of signal mixing apparatus and bandpass filtering is employed to couple either the mixer sum or difference frequency to the synthesizer output terminal. In some situations, a single mixer circuit and bandpass filter is employed. In other situations in which the desired frequency range and resolution cause undesired frequency components of the mixer signal to fall within the synthesized frequency range, mixing and filtering is effected in a number of subchannels, each of which include a mixer and filter. In such an arrangement, each mixer is commonly supplied with a signal selected from the set of M signals, the set of N signals is partitioned into a number of subsets that is identically equal to the number of subchannels employed, and the signal selection apparatus associated with the set of N signals supplies one signal of each signal subset to individual ones of the mixers.

17 Claims, 2 Drawing Figures

FREQUENCY SYNTHESIZER APPARATUS

BACKGROUND OF THE INVENTION

This invention relates to the field of frequency synthesis. More particularly, this invention relates to direct synthesis apparatus utilizing a minimum number of filter circuits to provide a desired number of output frequencies and a desired frequency resolution.

As is known in the art, the term "frequency synthesis" encompasses various methods and apparatus wherein a frequency conversion process is utilized to translate the signal frequency of one or more reference signals to a generally large number of output signal frequencies that are relatively stable in frequency and relatively pure in spectral content, each of which output frequencies can be individually selected as the frequency of the frequency synthesizer output signal. As is further known, frequency synthesis is utilized in a wide range of applications in which a number of stable, spectrally pure signal frequencies are required. For example, to eliminate the large number of crystal controlled oscillators that would otherwise be required, frequency synthesis is often utilized in channelized communication systems, especially those communications systems that employ frequency-hopping techniques, test and instrumentation systems, and frequency-agile radar systems.

Three basic frequency synthesis techniques have become known within the art and are commonly identified as direct frequency synthesis, indirect frequency synthesis and digital frequency synthesis. In apparatus employing direct frequency synthesis, the output frequencies are obtained directly from the frequency of one or more reference signals by the operations of mixing, filtering, frequency multiplication and frequency division. Indirect frequency synthesizers derive the output frequency from a secondary oscillator that is either phase-locked or frequency-locked to the frequency of a reference signal. In contrast, digital frequency synthesis is a sampled data technique in which a reference signal determines an invariant sampling interval and real-time digital computation is employed to calculate signal amplitudes, which when filtered, result in an analog signal of the desired frequency.

Each of the basic frequency synthesis techniques exhibits performance characteristics that often make a particular type of frequency synthesizer preferable in a particular design situation. For example, in comparison with apparatus utilizing digital frequency synthesis or direct frequency synthesis, apparatus employing indirect frequency synthesis exhibits relatively slow switching times with respect to changing between the available output frequencies. On the other hand, digital frequency synthesis generally requires a rather complex digital processor such as a programmed digital computer to compute the amplitude of the desired output signal at each of the predetermined sampling times. Accordingly, the use of direct frequency synthesis is often desirable or necessary.

One of the major problems with prior art direct synthesis has been the large number of rather complex multiple pole filters that are generally required to provide the desired number of output signal frequencies with the desired spectral purity. For example, in one basic implementation of direct frequency synthesis, the desired signal frequencies are developed by a harmonic generator, which provides a signal having signal components at frequencies harmonically related to that of a reference signal, and a harmonic selector, which includes a set of selective filters, each of which passes a desired output frequency. Since a large number of output frequencies are often required such apparatus presents a filtering requirement that necessitates an equally large number of structurally complex, multiple pole filters.

Direct frequency synthesis using iterated identical stages, sometimes called "mix-filter-divide" synthesis is another widely utilized direct synthesis technique. See, for example, chapters 2 and 3 of *Frequency Synthesis: Techniques and Applications*, edited by Gorski-Popiel, published by the IEEE Press, 1975, Library of Congress catalogue card #74-82502, and U.S. Pat. No. 3,838,355 issued to Papaieck. In apparatus utilizing iterated identical stages, a number of identical stages share a common set of K reference signals having frequencies that are spaced-apart from one another by a frequency increment $\Delta f$. Each stage includes a cascade arrangement of a mixer, a bandpass filter, a frequency divider, and a lowpass filter. An RF switch at each stage is operable (usually in response to a digital control signal) to apply a selected one of the reference signals to one input port of the mixer of that stage, with the second input port of the first circuit stage being supplied a signal having a frequency that is fractionally related to the frequency of one of the reference signals and the second input port of the mixer of each of the other stages being supplied with the output signal of the preceeding stage. The passband of the bandpass filter includes a desired mixer output frequency (usually the first sum frequency), which is divided by the factor K in the frequency divider. The lowpass filter eliminates harmonics in the output signal of the divider. As is known, such a circuit arrangement provides a plurality of signal frequencies $K^n$ where n is the number of stages employed with a frequency resolution of $\Delta f / K^{N-1}$.

Although a large number of signal frequencies can be supplied by apparatus utilizing iterated indentical stages, such apparatus requires a set of K precise reference signals either generated within the apparatus or applied from external sources. Further, such apparatus requires a relatively large number of digital and RF circuit components, including a large number of multiple pole filter arrangements.

Although such prior art direct frequency synthesis techniques and apparatus provides satisfactory operation in many situations, a need exists for less complex apparatus. Accordingly, it is an object of this invention to provide apparatus for direct frequency synthesis which is of relatively simple structure, often requiring only a single mixer to supply a desired number of frequencies.

It is another object of this invention to provide apparatus for the direct synthesis of a large number of signal frequencies from a single reference signal.

It is still another object of this invention to provide apparatus for directly synthesizing a large number of signal frequencies from a single reference signal wherein minimal signal filtering apparatus is required.

SUMMARY OF THE INVENTION

These and other objects are achieved in accordance with this invention by a circuit arrangement wherein a reference signal, having a predetermined frequency $f_r$, is utilized to form a first set of M discrete signals having frequencies $jf_r/M$, $(j + 1)f_r/M \ldots (j + M - 1)f_r/M$ and is utilized to form a set of N discrete signals having frequencies $kf_r$, $(k + 1)f_r$ ... $(k + N - 1)f_r$, where $j$ and $k$ are preselected integers identifying the lowest frequency signal of each of the two signal sets. In situations in which the desired range of output frequencies (output bandwidth) does not include spurious signals that can be generated within the circuit arrangement of the invention, a first and second signal selector respectively couples a first selected signal (derived from the set of N signals) and a second selected signal (derived from the set of M signals) to the first and second input ports of a single mixer. In this embodiment of the invention, a single bandpass filter effectively selects the desired signal component of the mixer output signal (e.g., the first sum frequency or upper sideband frequency of the signal supplied by the mixer) for use as the frequency synthesizer output signal. In applications in which such a single mixer-single bandpass filter arrangement would cause spurious signals that are generated within the mixer to fall within, or undesirably near, the output frequency band to thereby prevent satisfactory realization of a single bandpass filter, the invention is embodied with a set of mixers and bandpass filters which effectively form a plurality of separate signal paths or output subchannels.

In each embodiment of the invention, the set of M discrete signals is derived by a cascade circuit arrangement including a frequency divider, a harmonic generator, and a harmonic selector. The frequency divider is responsive to the reference signal and supplies a signal having a frequency of $f_r/M$ to the harmonic generator. The harmonic generator supplies a signal having signal components at each of the M signal frequencies included within the set of M discrete signals. The harmonic selector supplies a selected signal of the set of M signal frequencies to one input port of the mixer in the single mixer embodiment, or to one input port of each mixer in an embodiment utilizing multiple output subchannels as the first selected signal. Preferably, the harmonic selector includes a comb filter of the surface acoustic wave type, which generates each signal of the set of M signals, and an M-pole switch such as M diode ON/OFF gates that are individually operable to select one of the signals supplied by the comb filter as the first selected signal.

The set of N discrete signals is derived in each embodiment of the invention by a cascade circuit arrangement including another harmonic generator, which is responsive to the reference signal for supplying a signal having signal components at each of the N signal frequencies included in the set of N discrete signals, and another harmonic selector. In embodiments of the invention utilizing a single mixer and bandpass filter, the harmonic selector supplies a selected signal of the set of M signal frequencies to the second input port of the mixer. In embodiments of the invention in which a number of output subchannels, each including a mixer and bandpass filter, are desired or necessary, the harmonic selector effectively partitions the set of N signal frequencies into a number of frequency subbands identical in number to the number of subchannels employed. Each of the frequency subbands includes a number of signal frequencies that are spaced-apart from one another by a frequency interval equal to $f_r$ and one signal of each frequency subband is supplied to an associated mixer within one of the output subchannels. In this manner, the mixer of each output subchannel supplies a range of signal frequencies and a range of spurious signal frequencies that are spaced-apart from one another such that the bandpass filter of that particular subchannel can effectively separate the output signals from the spurious signal frequencies. To supply an output signal at the desired output frequency, the signals provided by the bandpass filters of the output subchannels are connected to an RF switch which is operable to supply the signal provided by a selected one of the output subchannels.

BRIEF DESCRIPTION OF THE DRAWINGS

Other objects and advantages of the present invention will become apparent to one skilled in the art after a reading of the following description, taken together with the accompanying drawing, in which.

DETAILED DESCRIPTION

Figure 1:
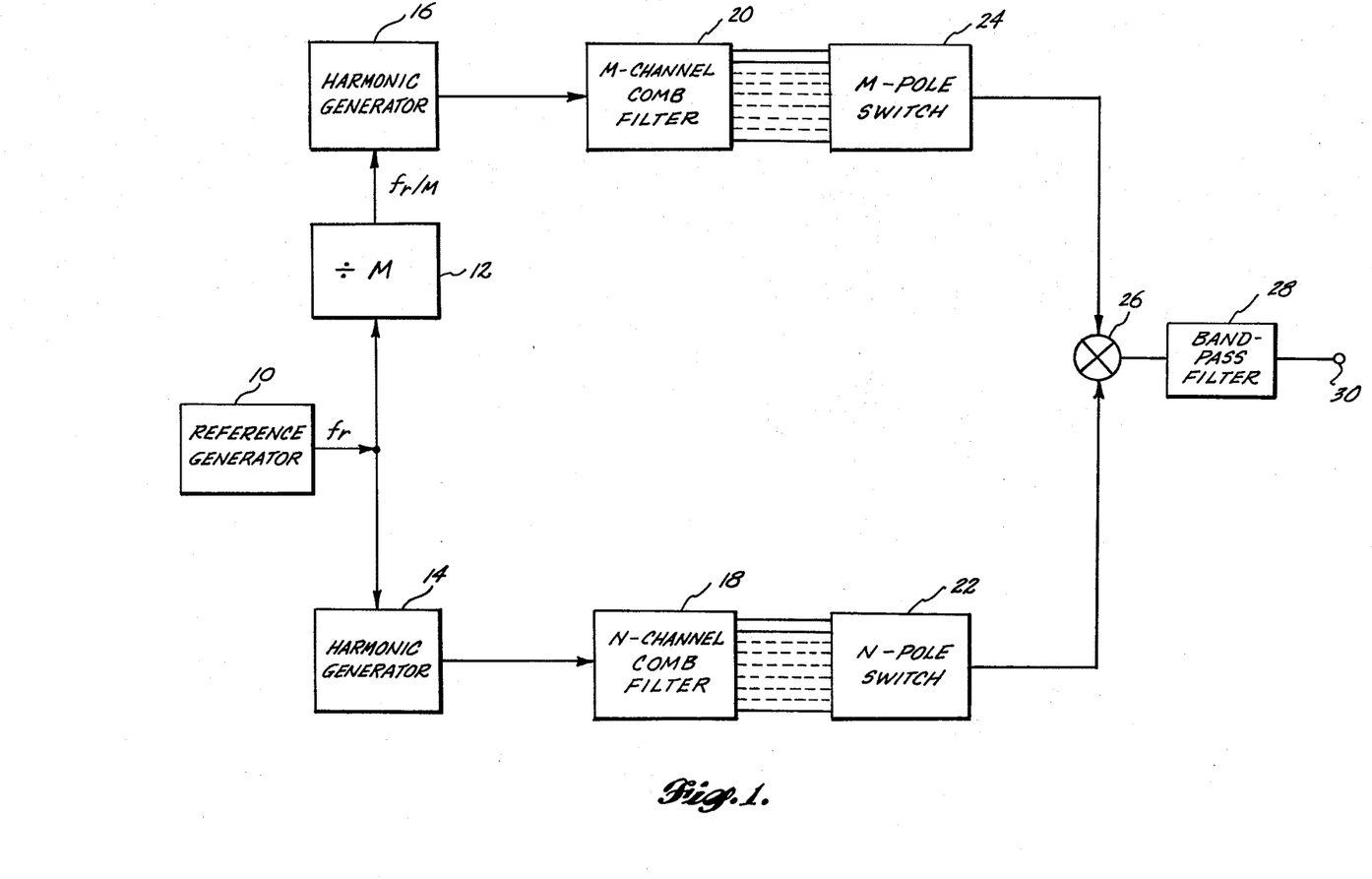
FIG. 1 is a block diagram of an embodiment of this invention wherein the desired range of output frequencies and the desired frequency resolution permits the use of a single mixer and single bandpass filter.

In the embodiment of the invention depicted in FIG. 1, an electrical signal at a frequency $f_r$ is supplied by a reference generator 10 and coupled to a frequency divider 12 and a harmonic generator 14. In accordance with this invention, reference generator 10 is a conventional signal source which supplies a stable, spectrally pure signal and frequency divider 12 is a conventional electrical circuit which supplies an output signal at a frequency $f_r/M$, where M is a preselected integer, to the input of a harmonic generator 16.

Harmonic generators 14 and 16 are conventional circuits that supply output signals having signal components at frequencies that are harmonically related to the frequency of the applied input signal ($f_r$ and $f_r/M$, respectively). Such circuits are well known in the art and generally include a non-linear device such as a "snap recovery" diode. Thus, in the arrangement of FIG. 1, the harmonic generator 14 supplies an output signal having frequency components, $f_r$, $2f_r$, $3f_r$, ... $pf_r$, where $p$ is an integer, to an N-channel comb filter 18 and the harmonic generator 16 supplies a signal to an M channel comb filter 20 with the supplied signal having frequency components at $f_r/M$, $2f_r/M$, $3f_r/M$ ... $qf_r/M$, wherein $q$ is an integer.

The comb filters 18 and 20 are conventional devices such as surface acoustic wave filters (SAW filters). As is known in the art, such SAW filters generally have a single electromagnetic wave to acoustic wave input transducer and a plurality of acoustic wave to electromagnetic wave output transducers mounted on a single piezoelectric substrate. Each acoustic wave to electromagnetic wave output transducer is structured to supply an electrical signal at a single predetermined frequency. In this respect, the comb filter 18 of FIG. 1 supplies a set of N discrete signals $kf_r$, $(k + 1)f_r$, $(k + 2)f_r$, ... $(k + N - 1)f_r$, where $k$ is a preselected integer and the comb filter 20 supplies a set of M discrete signals at frequencies $jf_r/M$, $(j + 1)f_r/M$, $(j + 2)f_r/M$ ... $(j + M - 1)f_r/M$, where $j$ is a preselected integer.

The set of N discrete signals supplied by the comb filter 18 and the set of M discrete signals supplied by the comb filter 20 are respectively coupled to an N-pole switch 22 and an M-pole switch 24. The switches 22 and 24 are conventional RF switching devices which respectively permit the selection of one of the signals supplied by the comb filter 18 and one of the signals supplied by the comb filter 20. Such switching devices often include a plurality of separate ON/OFF diode gates and control logic to turn on a single selected gate. For example, in the arrangement of FIG. 1, the N-pole switch 22 and the M-pole switch 24 can respectively include N and M separate diode gates under the control of digital signals having $\log_2 N$ and $\log_2 M$ bits, respectively. It should be recognized that both comb filter 18 and N-pole switch 22 and comb filter 20 and M-pole switch 24 operate conjunctively to form a harmonic selector for respectively selecting a predetermined harmonic of the input signal $f_r$ and a predetermined harmonic of the signal supplied by the frequency divider 12. As is known in the art, various other circuits can be utilized to effect harmonic selection, e.g., a drift-cancelled oscillator or a tunable phase-locked oscillator. At higher frequencies, especially wherein the output signal must be rapidly switched in frequency, the above-described SAW filters and RF switches are generally preferable.

In any case, the two selected signals are supplied to the input terminals of a conventional mixer 26. As is understood in the art, such a mixer can be typified as a three port electrical network having a non-linear transfer characteristic with respect to the relationship between the electrical parameters of the signal supplied to the two input ports and the electrical parameters of the output signal. Thus, in effect a mixer causes the two applied signals to undergo a modulation process which produces a mixer output signal having frequency components at the frequency of the two applied signals, e.g., $f_1$ and $f_2$; at the first sum and difference or sideband frequencies, $f_1 \pm f_2$; and, at the intermodulation frequencies, $af_1 \pm bf_2$ where $a$ and $b$ are integers and $a + b$ is an odd integer.

Mixers conventionally utilized in frequency synthesis are generally configured to maximize either the first sum frequency or the first difference frequency (i.e., $f_1 + f_2$ and $f_1 - f_2$, respectively, in the example above). Although either an "additive" or "subtractive" (often respectively denoted as upper and lower sideband mixers) type mixer arrangement can be utilized in the practice of this invention, the additive variety is generally preferred, since for a given range of output frequencies the upper sideband or additive type of mixer permits the use of lower frequency harmonic signals, i.e., minimum $k$ and $j$. Because of this and to simplify the mathematical description of the invention, embodiments of the invention utilizing the mixer first sum frequency are primarily described herein.

Embodying the invention with relatively low values of $k$ and $j$ in situations in which the reference frequency $f_r$ is not dictated by other considerations generally aids in suppressing coherent spurious signal components in the signal supplied by the frequency synthesizer of FIG. 1. More explicitly, comb filters 18, 20 such as the previously mentioned SAW filters do not supply a set of perfectly sinusoidal output signals, but each output signal includes signal components at various other frequencies that are harmonically related to the fundamental frequency of the signal applied to the comb filter. In particular, the relative magnitude of such extraneous signal components is generally inversely related to the "percent channel separation", which is a SAW filter parameter equal to the decimal ratio of the frequency interval between successive harmonic output signals and the frequency of the harmonic output signal. For example, for all other signal components to be at least 60db (decibels) below the level of the supplied harmonic signal, the percent channel separation of a typical SAW filter may have to exceed 1%. Since at least some of the extraneous signal components supplied by the comb filters will generally be within the passband of the system, such signals will appear in the frequency synthesizer output signal as undesired coherent spurious signals. Accordingly, choice of the parameters $f_r$, M, N, $j$ and $k$ of this invention is often at least partially dictated by the signal isolation achievable within the comb filters to be utilized, i.e., the percent channel separation.

Regardless of whether an additive or subtractive type of mixer 26 is employed, state-of-the-art mixers do not supply a purely sinusoidal signal at the desired sideband frequency, but such output signals include signal components at the other sideband frequency and at the intermodulation frequencies. To prevent such signals as appearing as significant, coherent spurious signals in the output signal supplied by the circuit of FIG. 1, a band bass filter 28 is connected between the output of the mixer 26 and the circuit output terminal 30.

Bandpass filter 28 is a conventional circuit arranged to pass signals within the frequency range of the signal frequency supplied by the circuit of FIG. 1 without substantial attenuation while greatly attenuating signals outside of this range. In particular, it can be ascertained from the above description of the circuit arrangement of FIG. 1 that, in embodiments utilizing the first sum frequency of the mixer 26, the minimum and maximum signal frequencies of the signal supplied to output terminal 30 are $kf_r + jf_r/M$ and $(k + N - 1)f_r + (j + M - 1)f_r/M$, respectively, with additional output signal frequencies spaced between these upper and lower frequencies on a frequency increment of $f_r/M$ being available by appropriate harmonic signal selection with the switches 22 and 24. Thus, the circuit of FIG. 1 supplies N times M output signals within the frequency range $kf_r + jf_r/M$ to $(k + N - 1)f_r + (j + M - 1)f_r/M$, with the resolution of $f_r/M$.

As previously described, the signal supplied by the mixer 26 at each selected output frequency includes spurious or "image" signal components with the primary image signal generally being at the first difference frequency. Thus it can be seen that bandpass filter 28 must reject or block image frequencies within the frequency range $kf_r - (j + M - 1)f_r/M$ to $(k + N - 1)f_r - jf_r/M$. Accordingly, for maximum suppression of spurious signal components in the circuit of FIG. 1, the highest image frequency $(k + N - 1)f_r - jf_r/M$ must be below the lowest output frequency $kf_r + jf_r/M$ by an amount adequate to permit the desired attenuation of the signal frequencies within the image frequency range. In this respect it can be shown that frequency separation, $\Delta$ between the highest image frequency and the lowest output frequency is $\Delta = f_r(2j/M - N + 1)$. Accordingly, it can be shown that, for the highest image frequency to be lower in frequency than the lowest output frequency, thus separating the band of image frequencies from the band of output frequencies, the condition $j > M(N - 1)/2$ must be satisfied.

As previously noted, the selection of the lowest usable harmonic $jf_r/M$, supplied by the comb filter 20 is generally determined in view of the isolation or percent channel separation characteristic of the comb filter.

Since M and N are generally selected to provide the desired number of output frequencies M times N, it can be seen that, to effect the desired design objectives, it may not be possible to utilize the circuit arrangement of FIG. 1. For example, consider an implementation of a frequency synthesizer in accordance with FIG. 1 utilizing a 16MHz reference signal to supply 256 output frequencies ranging between 960 and 1215MHz with a one megacycle frequency resolution. Since the desired output frequency resolution is provided when M is equal to 16, N must be equal to 16 to provide the desired 256 output frequencies. Further, to establish the lowest output frequency at 960MHz, it can be seen that $16k + j = 960$. As described above, to prevent one or more of the image signals from falling within the desired pass band of the bandpass filter 28, $j$ must exceed 120 i.e., the lowest harmonic signal provided by the comb filter 20 must be greater than 120Mhz. Accordingly, in such an implementation, the percent channel separation of the comb filter 20 would be considerably less than 1% and coherent spurious signals may be produced by the comb filter which would exceed the desired system requirements. In such a case, although compromises can be made in the selection of the comb filter 20 and the pass band of the filter 28 in an attempt to satisfy the synthesizer design goals, this invention can be advantageously implemented to utilize a lower value of $j$, thus permitting selection of a comb filter having adequate signal isolation between the necessary harmonic output signals, while simultaneously providing adequate frequency separation of the band of image frequencies and the band of output frequencies to permit the desired degree of output signal filtering.

Figure 2:
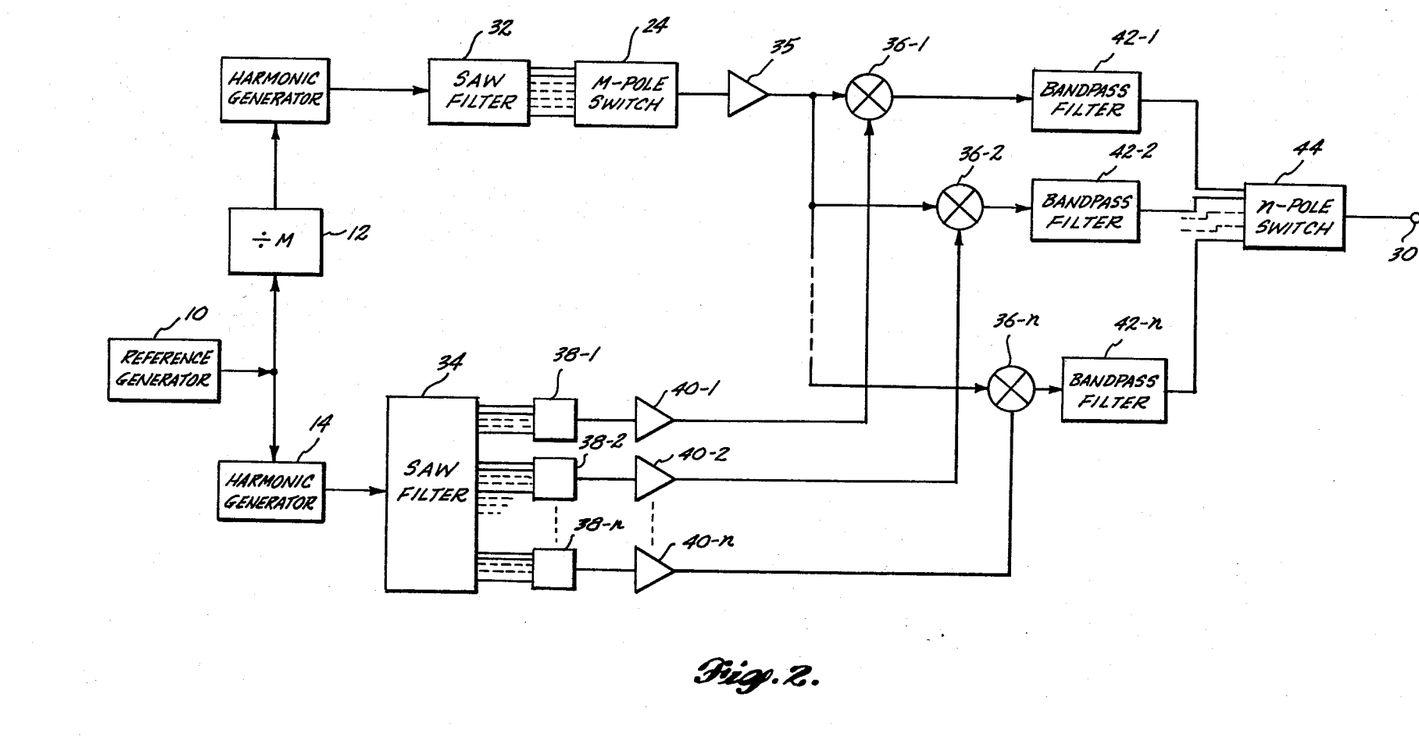
FIG. 2 is a block diagram of an embodiment of the invention wherein, because of the desired range of output frequencies and the desired frequency resolution, it is advantageous to employ a number of output subchannels, each including a mixer and bandpass filter.

In particular, referring to FIG. 2, the frequency synthesizer of this invention can be configured to effectively partition the N signals supplied by the N channel comb filter 18 into n separate frequency intervals or subbands each including N/n separate signals. In this arrangement, each subband of N/n signal frequencies is associated with a separate signal path that includes a switch, a mixer and a bandpass filter. As shall be described, partitioning the set of N signals and utilizing separate signals paths for mixing and filtering the signals within each frequency subband permits the frequency separation between those output signals coupled to a particular bandpass filter and the associated image frequencies to be established such that adequate filtering of the output signal is provided.

More explicitly, like the embodiment of FIG. 1, the circuit arrangement of FIG. 2 includes the reference generator 10, such as a crystal controlled oscillator, which supplies a signal at frequency $f_r$ to a frequency divider 12 and a harmonic generator 14. The signal supplied by the frequency divider 12, at frequency $f_r/M$ is coupled to a harmonic generator 16. The output signal supplied by the harmonic generators 14 and 16 are respectively connected to SAW filters 32 and 34 with the SAW filter 32 supplying a plurality of M output signals at frequencies $jf_r/M$, $(j + 1)f_r/m \ldots (j + M - 1)f_r/M$ and the SAW filter 34 supplying a plurality of N output signals at frequencies $kf_r$, $(k + 1)f_r, \ldots (k + N - 1)f_r$.

As in the circuit arrangement of FIG. 1, a single one of the M signals supplied by the SAW filter 32 is selected by the M-pole switching arrangement 24. The signal provided by the M-pole switch 24 is amplified within an amplifier 35 and coupled to an input port of each mixer 36-$i$, $i = 1, 2 \ldots n$ of a plurality of $n$ mixers.

As shall be described hereinafter, the integer $n$ is a "partitioning factor" selected to eliminate the previously described bandpass filter design constraints.

The N signals supplied by the SAW filter 34 are partitioned into n frequency subbands or subintervals, each having N/n signals by connecting each consecutive N/n output terminals of the SAW filter 34 with an associated N/n-pole switch 38-$i$, $i = 1, 2 \ldots n$. More specifically, each frequency subband includes N/n signal frequencies $(k + (i - 1)N/n)f_r$, $(k + (i - 1)N/n + 1)f_r, \ldots (k + (iN/n) - 1)f_r$, where $i$ is an integer between 1 and $n$ that denotes the "$i^{th}$" frequency subband. For example, if $n$ is equal to 4 and N is equal to 16, the first frequency subband includes four signals at the frequencies $kf_r$, $(k + 1)f_r$, $(k + 2)f_r$ and $(k + 3)f_r$; the four signals $(k + 4)f_r$, $(k + 5)f_r$, $(k + 6)f_r$ and $(k + 7)f_r$ are included in the second frequency subband; the four signals $(k + 8)f_r$, $(k + 9)f_r$, $(k + 10)f_r$ and $(k + 11)f_r$ are included in the third frequency subband; and, the final four signals $(k + 12)f_r$, $(k + 13)f_r$, $(k + 14)f_r$ and $(k + 15)f_r$ are included in the fourth frequency subband.

Each N/n-pole switch 38-$i$ is thus associated with the $i^{th}$ frequency subband and can be constructed similar to the M-pole switch 24 to supply a selected frequency of the $i^{th}$ frequency subband to an associated amplifier 40-$i$, $i = 1, 2 \ldots n$. Each amplifier 40-$i$ is connected to the second input port of an associated mixer 36-$i$. Like the amplifier 35, amplifiers 40-$i$ are conventional circuits with the gain factor of each amplifier being established to supply sufficient signal power to drive the mixers 36-$i$. Additionally, if desired or necessary, the frequency response of the amplifiers 35 and 40-$i$ can be established to equalize the signal levels of each signal supplied to the mixers 36-$i$.

In view of the above-described arrangement of FIG. 2, it can be seen that, in embodiments wherein the mixers 36-$i$ are configured to supply the first sum frequency, each mixer 36-$i$ supplies an output signal at a selectable frequency ranging between a lower frequency limit of $(k + (i - 1)N/n)f_r + jf_r/M$ and an upper frequency limit of $(k + (iN/n) - 1)f_r + (j + N - 1)f_r/M$. Thus, each mixer 36-$i$ supplies an output signal having a frequency that is selectable from MN/n frequencies that are spaced-apart from one another by frequency increments of $f_r/M$ with the mixers 36-$i$ collectively enabling selection of an output frequency identical to the selectable output frequencies provided by the embodiment of FIG. 1. For example, the mixer 36-1 of FIG. 2 supplies a signal having a frequency selectable from MN/n frequencies within the frequency range of $kf_r + jf_r/M$ to $(k - 1 + N/n)f_r + (j + M - 1)f_r/M$ with a frequency resolution of $f_r/M$. In a like manner, the mixer 36-2 supplies the nextmost group of MN/n output frequencies ranging between a frequency of $(k + N/n)f_r + jf_r/M$ to a frequency of $(k - 1 + 2N/n)f_r + (j + M - 1)f_r/M$. Accordingly, when the MN signals collectively supplied by the mixers 36-$i$ are considered, the arrangement of FIG. 2 supplies a signal of selectable output frequency identical to the signal frequencies provided by the embodiment of FIG. 1.

In FIG. 2, the signal provided by each mixer 36-$i$ is coupled to an associated bandpass filter 42-$i$, $i = 1, 2 \ldots n$, with the output signals of each filter 42-$i$ being coupled to a n-pole switch 44. The n-pole switch 44 can be similar in construction to the switch 24 and 38-$i$ and is arranged to couple the signal supplied by a particular one of the mixers 36-$i$ to the circuit output terminal 30.

In particular, if the desired output frequency is within the $i^{th}$ frequency subband, the switch 44 interconnects the output terminal 30 with the signal supplied by the bandpass filter 36-i. In some realizations of the invention depicted in FIG. 2, it may be advantageous to arrange the n switches 38-i, $i$ equals $1, 2 \ldots n$ such that only one particular switch 36-i is activated at any given time, hence activating only the associated mixer 36-i. In such an arrangement, the switch 44 can be replaced by a simple signal summing network or, alternatively, the switch 44 can be activated by the same control signal that activates the $i^{th}$ switch 38-i to automatically select the signal supplied by the $i^{th}$ bandpass filter 42-i.

In any case, in view of the arrangement of the embodiment in FIG. 2, it can be shown that the frequency separation, $\Delta_i$, between the lowest signal frequency and highest frequency image signal that is coupled to the $i^{th}$ bandpass filter, 42-i is $\Delta_i = f_r(2j/M + 1 - N/n)$. Comparing this expression with the previously described expression for the frequency separation of the embodiment of FIG. 1, it can be seen that a frequency separation of up to $2jf_r/M$ can be effected by appropriately selecting the partitioning factor $n$. Thus, in design situations in which $j$ is not greater than $M(N - 1)/2$ by an amount sufficient to permit adequate output signal filtering with the embodiment of FIG. 1, the embodiment of FIG. 2 is advantageously employed rather than the embodiment of the invention depicted in FIG. 1.

For example, again considering the previously referenced implementation of the invention in which a 16MHz reference signal is utilized to supply an output signal having an output frequency selectable from 256 frequencies within a frequency range of 960 to 1215MHz, with a frequency resolution of 1MHz. As previously noted, to satisfy the desired number of output frequencies with the desired frequency resolution and the 16MHz reference frequency, both M and N are necessarily equal to 16 and $16k + j = 960$. Selecting $j$ equal to 64 and $k$ equal to 56, for example, satisfies this boundary condition in $k$ and $j$ and simultaneously provides a percent channel separation for SAW filters 32 and 34 which exceed 1% and hence maintain adequate signal isolation within each of the SAW filters 32 and 34 to thereby minimize coherent spurious signal generation in this portion of the circuit. With suitable values of M, N, $f_r$, $j$ and $k$ established, it can be seen that the frequency separation between the band of image frequencies and the band of signal frequencies for each bandpass filter 42-i is $\Delta_i = 16(9 - 16/n)$, where $n$ is the previously defined partitioning factor.

Accordingly, if $n$ is 2 or greater, the highest image frequency will be lower in frequency than the lowest signal frequency. It can be noted that, in this particular realization of the embodiment of FIG. 2, if $n$ is set equal to 16, a maximum frequency separation of $2jf_r/M = 128$MHz can be achieved. Generally in the practice of this invention, a minimum value of $n$ which permits convenient realization of the band pass filters, 42-i is selected since each incremental increase in the value of $n$ increases the circuit complexity by the addition of another mixer 36-i, another band pass filter 42-i and an additional pole within the switch 44, i.e., another diode gate and associated control circuitry.

It should be recognized by those skilled in the art that the embodiments of the invention described herein are exemplary in nature and that many variations therein can be practiced without departing from the scope and spirit of this invention. For example, as previously indicated, the mixers 26 and 36-i, $i$ equal $1, 2 \ldots n$, can be configured to supply the first difference frequency of the applied signals rather than the first sum frequency. In this respect, it should be recognized that the foregoing discussion applies to such an embodiment with the bandpass filters being configured to pass the full set of difference frequencies and reject the full set of sum frequencies, i.e., the signal frequencies denoted herein as image frequencies become the signal frequencies and the signals denoted herein as the signal frequencies become the image frequencies. Such an embodiment of the invention thus supplies a selectable output frequency in the range $kf_r - (j + M - 1)f_r/M$ to $(k + N - 1)f_r - jf_r/M$, i.e., in the described design example output signals ranging between 817 and 1072MHz would be supplied with a 1MHz frequency resolution or the original frequency range of 960 to 1215MHz could be supplied, for example, by establishing both $j$ and $k$ equal to 65.

Further, it should be recognized that although the embodiment of FIG. 2 has, for the sake of simplicity been described such that the signals supplied by the SAW filter 34 are partitioned into $n$ subbands each having an equal number of signal frequencies, partitioning into $n$ subbands wherein each subband does not contain the same number of signals is possible. In such an arrangement, the frequency separation between the highest frequency image signal and the lowest frequency output signal will not be the same value for each of the signal paths or frequency subbands. In particular, the frequency separation exhibited in the signal supplied by the mixer 36 that is associated with the subband including the greatest number of signals will be less than the frequency separation exhibited by mixers 36 that operate with subbands containing a lesser number of signals. Specifically, it can be shown that, if the number of signals within any subband is $z$, the frequency separation between the highest image signal frequency and the lowest signal frequency of the set of signals supplied by the associated mixer is equal to $f_r(1 - z + 2j/M)$. For example, in the described design application of the embodiment of FIG. 2 for supplying 256 output frequencies ranging between 960 and 1215MHz, if the 16 signals supplied by the SAW filter 34 are partitioned into three subbands with one subband including six signal frequencies and the two remaining subbands each including five signal frequencies, the frequency separation in the signal path associated with the subband including the six signal frequencies is 48MHz and the frequency separation in the two remaining signal paths is 64MHz. In contrast, when the 16 signals supplied by the SAW filter 34 are partitioned into two subbands, each having eight signals, the frequency separation is 16MHz in each output signal path and when the 16 signals are partitioned into four subbands, each having four signals, the frequency separation is 80MHz in each output signal path.

The embodiments of the invention in which an exclusive property or privilege is claimed are defined as follows:

1. Signal generating apparatus responsive to an applied signal having a frequency of $f_r$ for supplying an output signal at any one of a plurality of M times N output frequencies, where M and N are preselected non-zero integers, said signal generating apparatus comprising:

frequency divider means responsive to said applied signal for supplying a first signal at a frequency of $f_r/M$;

first spectrum generating means responsive to said first signal for supplying a second signal including a plurality of at least M signal components, said M signal components being at the frequencies $jf_r/M$, $(j+1)f_r/M \ldots (j+M-1)f_r/M$ where $j$ is a preselected non-zero integer that is not greater than the quantity $M(N-1)/2$;

second spectrum generating means responsive to said applied signal for supplying a third signal including a plurality of at least N signal components, said N signal components being at the frequencies $kf_r$, $(k+1)f_r, \ldots (k+N-1)f_r$ where $k$ is a preselected non-zero integer;

first signal selection means responsive to said second signal for supplying a first selected signal at a selected frequency corresponding to the frequency of one of said signal components of said set of M signal components;

a plurality of $n$ signal paths wherein $n$ is selected such that said integer $j$ is numerically greater than the quantity $M(N-n)/2n$; each of said signal paths including mixer means responsive to said first selected signal and responsive to a second selected signal for supplying a signal including at least one signal component having a frequency that is a predetermined mathematical combination of the frequencies of the first and second selected signals, each of said signal paths further including signal filtering means responsive to said signal supplied by said mixer means for supplying said output signal at one of said M times N output frequencies, said signal filtering means having a passband including a predetermined signal component of said signal supplied by said mixer means of said signal path; and, second signal selection means responsive to said third signal for supplying a plurality of n second selected signals, each of said second selected signals corresponding in frequency to a different one of said signal components of said set of N signal components, said second signal selection means including means for supplying each of said second selected signals to a separate mixer means of said $n$ signal paths.

2. The signal generating apparatus of claim 1 wherein each of the mixer means of said n signal paths supplies a signal having a signal component at a frequency corresponding to the mathematical sum of the frequency of said first selected signal and the frequency of the second selected signal applied to that particular mixer, said passband of the signal filtering means included in the signal path which includes said particular mixer including frequencies equal to the mathematical sum of the frequencies of each first and second selected signal applied to said particular mixer by said first and second signal selection means.

3. The signal generating apparatus of claim 2 wherein said first signal selection means includes a first comb filter responsive to said second signal for supplying said set of M signals and an M-pole switch responsive to said set of M signals for supplying a selected one of said set of M signals as said first selected signal; and wherein said second signal selection means includes a second comb filter and a set of $n$ switching means, said second comb filter means responsive to said third signal for supplying said set of N signals, each switching means of said plurality of $n$ switching means being interconnected with said second comb filter means for receiving a predetermined number of signals of said set of N signals, each of said $n$ switching means being connected to supply one of said received signals to an individual one of said mixer means of said n signal paths as said second selected signal.

4. The signal generating apparatus of claim 3 wherein $N/n$ is an integer and each of said $n$ switching means is interconnected with said second comb filter means for receiving a plurality of $N/n$ signals of said plurality of N signals, the $i^{th}$ one of said $n$ switching means receiving those $N/n$ signals of said plurality of N signals having frequencies of $(k + (i - 1)N/n)f_r, (k + (i - 1)N/n + 1)f_r, \ldots (k + (iN/n) - 1)f_r$ where $i$ is an integer ranging between 1 and $n$ that identifies each particular one of said $n$ switching means and each particular one of said $n$ signal paths; and wherein the passband of said signal filtering means included in the signal path responsive to the second selected signal supplied by said $i^{th}$ one of said switching means includes signal frequencies within the frequency range between $(k + N(i - 1)/n)f_r + jf_r/M$ and $(k - 1 + Ni/n)f_r + (j + M - 1)f_r/M$ and excludes signal frequencies within the range between $(k + N(i - 1)/n)f_r - (j + M - 1)f_r/M$ and $(k + (iN/n) - 1)f_r - jf_r/M$.

5. The signal generating apparatus of claim 4 wherein said first and second comb filter means comprise surface acoustic wave filters.

6. The signal generating apparatus of claim 4 further comprising oscillator means for supplying said applied signal at said frequency $f_r$, means for connecting the signal supplied by said oscillator means to said frequency divider means and means for connecting said signal supplied by said oscillator means to said second spectrum generating means.

7. The signal generating apparatus of claim 4 further comprising a first amplifier connected between said M-pole switch and each of said mixer means of said n signal paths for amplifying said first selected signal, and a set of $n$ amplifiers, each individual one of said set of $n$ amplifiers being interconnected between one of said plurality of $n$ switching means and said mixer means of an individual one of said $n$ signal paths for amplifying each of said second selected signals.

8. The signal generating apparatus of claim 4 further comprising third signal selection means interconnected to receive said signal supplied by each of said signal filtering means of said $n$ signal paths, said third signal selection means including means for supplying one of said signals supplied by said signal filtering means as said output signal at one of said M times N output frequencies.

9. Frequency synthesizer apparatus responsive to an applied signal having a frequency $f_r$ for supplying a substantially single frequency output signal at a frequency selectable from a plurality of output frequencies, said plurality of output frequencies including a number of frequencies numerically equal to the mathematical product of M times N, where M and N are preselected integers, said output frequencies being spaced-apart from one another in the frequency domain by a frequency interval equal to $f_r/M$, said frequency synthesizer apparatus comprising:

frequency divider means responsive to said applied signal for supplying a first signal having a frequency $f_r/M$ first harmonic generator means responsive to said first signal for supplying a second signal having a plurality of at least M signal components, said M signal components being at the frequencies $jf_r/M$, $(j+1)f_r/M \ldots (j+M-1)f_r/M$ where $j$ is a preselected non-zero integer that is greater than the quantity $M(N-1)/2$;

first harmonic selector means responsive to said second signal for supplying a first selected signal at a frequency corresponding to the frequency of a selected one of said M signal components of said second signal;

second harmonic generator means responsive to said applied signal for supplying a third signal having a plurality of at least N signal components, said N signal components being at the frequencies $kf_r$, $(k+1)f_r, \ldots (k+N-1)f_r$ where $k$ is a preselected non-zero integer;

second harmonic selector means responsive to said third signal for supplying a second selected signal at a frequency corresponding to the frequency of a selected one of said N signal components of said third signal;

a single mixer means responsive to said first selected signal and responsive to said second selected signal, said mixer means supplying a signal having a first signal component at a frequency equal to the sum of the frequencies of said first and second selected signals and having a second signal component at a frequency equal to the difference between the frequencies of said first and second selected signals; and a single filter means responsive to said signal supplied by said mixer means for supplying said substantially single frequency output signal at said selectable output frequency, said filter means having a passband including a predetermined one of said first and second signal components for each first and second selected signal supplied by said first and second harmonic selector means, said passband substantially excluding signals at the other one of said first and second signal components of said signal supplied by said mixer means.

10. The frequency synthesizer apparatus of claim 9 wherein said mixer means is configured and arranged to supply a signal having a primary signal component at a frequency corresponding to the sum of said frequencies of said first and second selected signals; and wherein said filter means includes a passband having a frequency range extending at least between a frequency of $kf_r + jf_r/M$ and a frequency $(k+N-1)f_r + (j+M-1)f_r/M$, said filter means having a rejection band including frequencies in the frequency range between $kf_r - (j+M-1)f_r/M$ and $(k+N-1)f_r - jf_r/M$.

11. The frequency synthesizer apparatus of claim 10 wherein said first harmonic selector means includes first comb filter means responsive to said second signal for supplying a first set of discrete signals, said first set of discrete signals including a signal at the frequency of each of said M signal components $jf_r/M$, $(j+1)f_r/M \ldots (j+M-1)f_r/M$, said first harmonic selector means further including M-pole switching means for selectively supplying one of said discrete signals of said first set of discrete signals as said selected signal component of said second signal; and wherein said second harmonic selector means includes second comb filter means responsive to said third signal for supplying a second set of discrete signals, said second set of discrete signals including a signal at the frequency of each of said N signal components $kf_r$, $(k+1)f_r \ldots (k+N-1)f_r$, said second harmonic selector means further including N-pole switching means for selectively supplying one of said discrete signals of said second set of discrete signals as said selected signal component of said third signal.

12. A frequency synthesizer responsive to an applied signal of a frequency $f_r$ for supplying an output signal having a selectable output frequency, said selectable output frequency being one of M times N discrete frequencies spaced-apart from one another by a frequency interval $f_r/M$ and ranging between a lower frequency of $kf_r + jf_r/M$ and an upper frequency of $(k + N - 1)f_r + (j + M - 1)f_r/M$, where N, M, $j$ and $k$ are preselected non-zero integers, said frequency synthesizer comprising:

frequency divider means responsive to said applied signal of frequency $f_r$ for supplying a signal at a frequency $f_r/M$;

first spectrum generating means responsive to said signal supplied by said frequency divider means for supplying a signal having signal components harmonically related to said signal supplied by said frequency divider means, said signal supplied by said first spectrum generating means including M signal components at frequencies of $jf_r/M$, $(j + 1)f_r/M \ldots (j + M - 1)f_r/M$;

signal selector means responsive to said signal having said M signal components for supplying a selected signal at one of said frequencies $jf_r/M$, $(j + 1)f_r/M \ldots (j + M - 1)f_r/M$;

second spectrum generating means responsive to said applied signal of frequency $f_r$ for supplying a signal having signal components harmonically related to said applied signal, said signal supplied by said second spectrum generating means including N signal components at frequencies of $kf_r$, $(k + 1)f_r \ldots (k + N - 1)f_r$;

first comb filter means responsive to said signal having said N signal components for supplying a set of N discrete signals, each discrete signal in said set of N discrete signals having a frequency equal to one of said frequencies $kf_r$, $(k + 1)f_r, \ldots (k + N - 1)f_r$;

a plurality of $n$ switching means, where $n$ is a preselected non-zero integer, each switching means of said plurality of $n$ switching means being connected for receiving a preselected integral number $z$ of the signals of said set of N discrete signals with the $z_i$ signals supplied to said $i^{th}$ one of said plurality of n switching means being separated from one another by a frequency interval equal to $f_r$, where $i$ is an integer ranging between 1 and $n$ which identifies each particular one of said $n$ switching means and the integral numbers $z_i$, $i = 1, 2 \ldots n$ are selected such that the mathematical summation of $z_i$ over the range $i$ equal to one to $i$ equal $n$ is identically equal to said integer N, each of said $n$ switching means for selecting and supplying a signal from those preselected signals received by that one of said n switching means;

a plurality of $n$ mixers, each of said $n$ mixers having first and second input ports and an output port, said first input port of each of said $n$ mixers being connected for receiving said selected signal supplied by said signal selector means, said second input port of the $i^{th}$ one of said mixers, $i = 1, 2 \ldots n$, being interconnected for receiving said signal supplied by the $i^{th}$ one of said plurality of n switching means;

a plurality of $n$ signal filters, the $i^{th}$ one of said plurality of signal filters being connected to said output port of said $i^{th}$ mixer of said plurality of n mixers; and output means responsive to the signals supplied by said plurality of $n$ signal filters for selecting and supplying one of said signals supplied by a particular one of said plurality of n signal filters as said output signal at said selected frequency.

13. The frequency sythesizer of claim 12 wherein each switching means of said plurality of n switching means is connected for receiving an integral number $N/n$ of said signals of said set of N signals, and wherein the $i^{th}$ one of said plurality of signal filters exhibits a passband including signals in the frequency range between $(k + N(i - 1)/n)f_r + jf_r/M$ and $(k - 1 + Ni/n)f_r + (j + M - 1)f_r/M$ for each integer $i = 1, 2 \ldots n$.

14. The frequency synthesizer of claim 13 wherein said signal selector means includes a second comb filter means and an M-pole switch, said second comb filter means responsive to said signal supplied by said first spectrum generating means for supplying a set of M discrete signals, each discrete signal of said set of M discrete signals having a frequency equal to a separate one of said M signal components at frequencies $jf_r/M$, $(j + 1)f_r/M \ldots (j + M - 1)f_r/M$, said M-pole switch including means for supplying one of said signals of said set of M discrete signals as said selected signal.

15. The frequency synthesizer of claim 14 wherein said output means includes an n-pole switch connected to receive each of said signals supplied by said plurality of $n$ signal filters, said n-pole switch being operable to supply a signal supplied by a selected one of said signal filters as said frequency synthesizer output signal.

16. The frequency synthesizer of claim 15 further comprising oscillator means for supplying said applied signal at said frequency $f_r$, and means for connecting said signal supplied by said oscillator means to said frequency divider means and to said second spectrum generating means.

17. The frequency synthesizer of claim 16 wherein said first and second comb filter means each include a surface acoustic wave filter.

* * * * *

UNITED STATES PATENT AND TRADEMARK OFFICE
CERTIFICATE OF CORRECTION

PATENT NO. : 4,105,949
DATED : August 8, 1978
INVENTOR(S) : Robert H. Hardin

It is certified that error appears in the above-identified patent and that said Letters Patent are hereby corrected as shown below:

Column 8, line 16, "$(k + 05)f_r$" should be —$(k + 5)f_r$—.

Signed and Sealed this

Thirteenth Day of March 1979

[SEAL]

Attest:

RUTH C. MASON
*Attesting Officer*

DONALD W. BANNER
*Commissioner of Patents and Trademarks*